United States Patent [19]

Eilley

[11] Patent Number: 4,891,609
[45] Date of Patent: Jan. 2, 1990

[54] RING OSCILLATOR
[75] Inventor: Edward S. Eilley, Reigate, England
[73] Assignee: U.S. Philips Corporation, New York, N.Y.
[21] Appl. No.: 279,388
[22] Filed: Dec. 2, 1988
[30] Foreign Application Priority Data
Dec. 22, 1987 [GB] United Kingdom ................. 8729915
[51] Int. Cl.⁴ .............................................. H03B 1/00
[52] U.S. Cl. ................................ 331/57; 331/108 A; 331/108 B; 331/135
[58] Field of Search ................. 331/57, 108 R, 108 A, 331/108 B, 135; 307/304
[56] References Cited
U.S. PATENT DOCUMENTS
3,931,588  1/1976  Gehweiler ........................... 331/57
4,142,114  2/1979  Green .................................. 307/304
4,656,369  4/1987  Lou ................................... 331/57 X Primary Examiner—Eugene R. Laroche
Assistant Examiner—Robert J. Pascal
Attorney, Agent, or Firm—Bernard Franzblau

[57] ABSTRACT

A ring oscillator circuit comprises a plurality of inverter states (301, 302, 303) connected in a series loop. Each stage has a voltage input (315, 315', 315") with an associated input capacitance and input threshold voltage, and a current output (316, 316', 316"). An active output circuit regulates the output currents so as to regulate the frequency of oscillation. A single reference circuit (307) can be used by more than one stage. The output circuit can vary the output currents to compensate for variable supply voltages. The oscillator can be used as part of a bias generator in an integrated circuit.

18 Claims, 3 Drawing Sheets

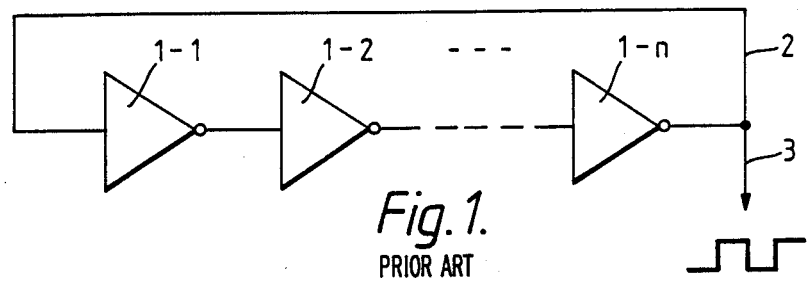
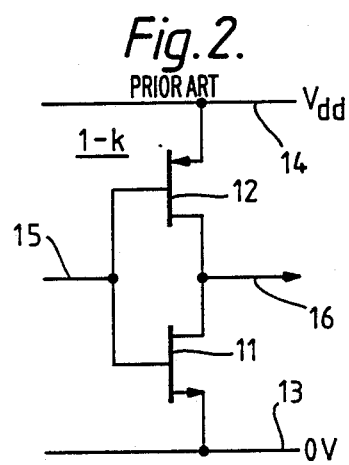
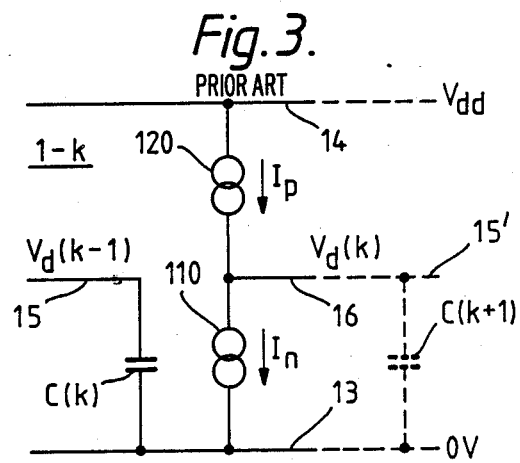
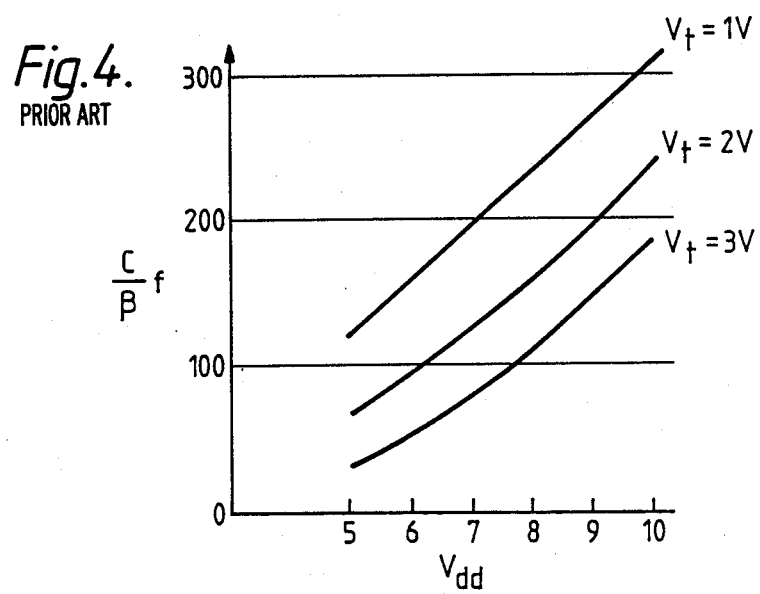

RING OSCILLATOR

BACKGROUND OF THE INVENTION

This invention relates to a ring oscillator comprising a plurality of cascaded inverting stages, each stage comprising an input circuit for detecting an output voltage of a preceding stage.

Such oscillators are widely known in the art of integrated circuit manufacture and may conveniently be constructed using simple inverting logic circuits (NOT, NAND, NOR and so on) as the inverting stages. The circuits may, for example, be TTL or CMDS logic circuits so that, as well as being very simple, the oscillator may be integrated conveniently with other circuits. The current output of each stage takes a finite time to charge or discharge the input capacitance of the following stage to the threshold voltage. The number of inverting stages is odd and the stages are cascaded in a loop so that at a certain frequency a 180-degree phase shift is imparted to signals passing around the loop. Provided the loop gain is large enough, the signals soon become non-linear and square-wave oscillations are produced which can be used for a variety of purposes. In metal-oxide-semiconductor (MOS) integrated circuits, ring oscillators are commonly used to drive 'charge pump' circuits for providing a bias voltage, for example, for substrate biasing, as disclosed in U.S. Pat. No. 4,142,114, for example.

Despite being both self-starting and relatively simple, such ring oscillators suffer from large uncertainty in the frequency of oscillation, due to variations both in the process used to fabricate the circuit and in operating conditions such as supply voltage and temperature. This problem arises because the frequency is determined solely by parameters inherent to the inverter stages and the devices used to construct them for a given number of inverters.

Therefore, the known oscillators cannot easily be designed to have a well-defined oscillating frequency, and in particular the natural frequency of such oscillators tends to be higher than is desirable. Because the inverters are operating at a frequency close to their maximum operating frequency and because the circuitry driven by the oscillator is normally of the same logic family as the inverters, that circuitry too is operated at a frequency close to its limit and operation of the circuit as a whole may be degraded unnecessarily. It should be appreciated that the frequency cannot be reduced merely by increasing the number of stages indefinitely because other modes of oscillation (harmonics) can occur at higher frequencies, and in practice this limits the number of stages to about seven or nine.

SUMMARY OF THE INVENTION

It is an object of the invention to provide a ring oscillator wherein the frequency of oscillation can be defined more predictably than in the known oscillators.

The invention provides a ring oscillator comprising, a plurality of cascaded inverting stages, each stage comprising an input circuit for detecting an output voltage of a preceding stage, characterized in that at least one inverting stage further comprises an output circuit having a current source that is controlled by said input circuit for supplying an output current to an input of a succeeding stage. By providing a separate, active output circuit in the inverting stage, the time delay caused by the stage can be made independent of the ill-defined and/or variable characteristics of the devices and circuits employed.

The other inverting stages may be of the same form as the one inverting stage. Stages of the same form as the one stage may, for example, be constructed with different or variable current sources in their output circuits, or with additional inputs or outputs. Some of the other inverting stages may on the other hand be conventional inverting logic circuits. Any combination is possible subject to the overriding criterion for oscillation that there must be a 180-degree phase shift around the loop and sufficient loop gain at the frequency of oscillation.

The input circuit may comprise a logic circuit. In such a case, the input capacitance of the next stage may consist mainly of the inherent input capacitance of the logic circuit, the regulated output current supplied to the succeeding stage being smaller in magnitude than an output current of the said logic circuit. Thus, the frequency of oscillation can be controlled to be well below the operating limit, which may increase the reliability of operation of the circuitry driven by the oscillator. If the output current is many times smaller, perhaps an order of magnitude or more, then additional propagation delays inherent in the components of the inverting stage will be relatively small and the magnitude of the output current will be the dominant frequency-determining parameter.

In a ring oscillator constructed in CMOS technology, the output circuit may be responsive to a supply voltage which is also applied to an input circuit of the succeeding stage so as to make the associated output current dependent on the supply voltage and thereby reduce the dependence of the frequency of oscillation on the supply voltage. It is known that the input threshold voltage of CMOS logic circuits is approximately proportional to the supply voltage. Therefore, by making the output current more or less proportional to the supply voltage, and hence to the input threshold voltage, the time delay through the or each stage can be made substantially constant.

The oscillator may comprise a reference circuit for determining a magnitude of the output current of at least one said output circuit. The oscillator may comprise a single reference circuit for determining magnitudes of the output currents of the output circuits of all of the inverting stages. This is not only economical, but may allow control of all the stages by means of a single circuit variable, for example a single resistance, or a reference voltage or current.

The reference circuit may include a resistance and the input of a current mirror in series across a voltage supply. Such a circuit is simple and may be particularly useful if the output current is required to vary in response to the supply voltage.

For more accurate proportionality between the output current and the supply voltage, the reference circuit may include a potential divider and voltage follower arrangement for generating a reference current proportional to the supply voltage.

The output circuit may comprise a first current source for supplying a first current to the output of the one stage at least when the voltage at the input to the one stage is in a first state, and a second current source for supplying a second current to the output, in the opposite direction to the first current, at least when the voltage at the input to the one stage is in a second state. The first current source may comprise an output of a first current mirror circuit and the second current source may comprise an output of a second current mirror circuit of opposite conductivity type to the first current mirror.

The first current source may be enabled whatever the state of the voltage at the input to the one stage, the second current source being enabled only when the voltage at the input to the one stage is in a predetermined one of the first and second states, the second current being greater in magnitude than the first current. Thus it is only necessary to switch one current source to reverse the direction of the output current of the stage, rather than switching both sources on and off in anti-phase. The magnitude of the second current may be substantially twice that of the first current. This causes the output currents during the two parts of the cycle to be opposite in direction and substantially equal in magnitude. This enables a one-to-one mark-space ratio to be obtained.

At least one stage may comprise a second input which forms a control input for disabling the oscillator.

The invention further provides an integrated circuit comprising such a ring oscillator. The ring oscillator may form part of a bias-generator circuit.

BRIEF DESCRIPTION OF THE DRAWINGS

Embodiments of the invention will now be described, by way of example, with reference to the accompanying drawings, in which:

FIG. 1 is a block schematic diagram of a known ring oscillator;

FIG. 2 shows a known CMOS embodiment of an inverter circuit for use as one stage in the oscillator of FIG. 1;

FIG. 3 is an equivalent circuit of the inverter of FIG. 2;

FIG. 4 is a graph showing the dependence of the oscillator frequency on various parameters in a known CMOS ring oscillator;

DESCRIPTION OF THE PREFERRED EMBODIMENTS

Figure 5:
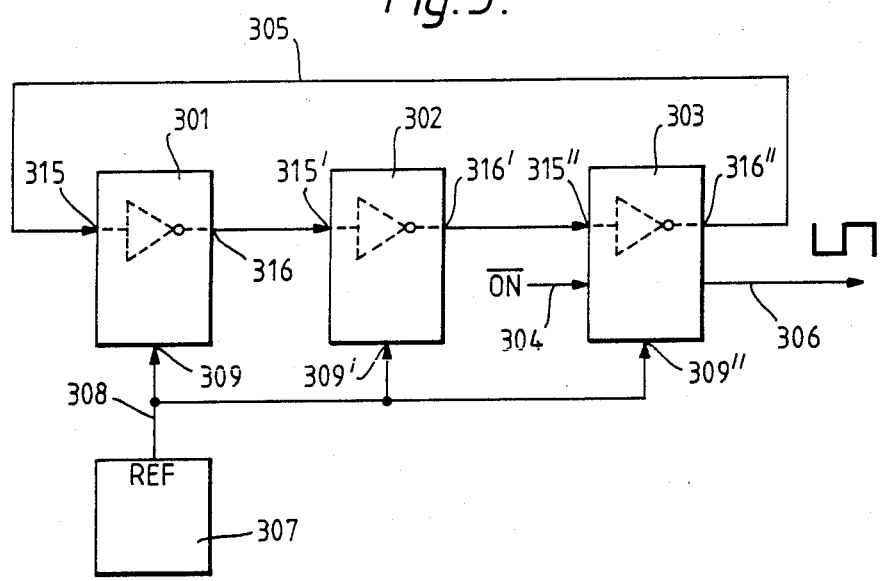
FIG. 5 is a block schematic diagram of an embodiment of a ring oscillator in accordance with the present invention.

FIG. 1 is a block schematic diagram of a known ring oscillator. The circuit comprises a number n of inverter circuits 1-1 to 1-n. Each inverter has an input and an output, the output of the kth inverter 1-k being connected to the input of the next t inverter, 1-(k+1). The output of the nth inverter 1-n is connected via a feedback path 2 to the input of the first inverter to close the loop. The output of the nth inverter also forms an output 3 of the oscillator. The number n of inverters is an odd number, 3 or more, and the circuit acts as a phase-shift oscillator whose natural frequency of oscillation f is that for which a phase lag of 180 degrees occurs over the chain of inverters 1-1 to 1-n. In practice, the very high gain of logic circuits ensures that the circuit becomes highly non-linear and generates a square wave of frequency f at the output 3. The period 1/f of the square wave is simply twice the propagation delay through the n inverters. A similar square wave is present at the output of each inverter 1-1 to 1-n, with a phase shift of 180/n degrees each time (assuming that all inverters 1-1 to 1-n are identical). Consequently, the oscillator output could be taken from the output of any of the inverters.

FIG. 2 shows a well-known complementary metal-oxide-semiconductor (CMOS) implementation of a typical inverter, for example, the kth inverter 1-k in the ring oscillator of FIG. 1. The inverter 1-k comprises an n-channel MOS field-effect transistor (MOSFET) 11 and a p-channel MOSFET 12 connected in series across voltage supply terminal 13 at zero volts and terminal 14 at a positive voltage $V_{dd}$. CMOS logic circuits are tolerant of a wide range of supply voltages and $V_{dd}$ may vary, for example, between +5 V or less and +15 V or more. The gate electrodes of the MOSFETs 11 and 12 are connected together and form the input 15 of the inverter 1-k. The drain electrodes of the MOSFETs 11 and 12 are connected together and form the output 16 of the inverter 1-k.

FIG. 3 shows an equivalent circuit for the inverter 1-k, which illustrates the cause of the propagation delay which determines the oscillator frequency f. The input 15 of the circuit is connected to a capacitor C(k), to represent the input capacitance of the inverter 1-k. C(k) may simply be the gate capacitance of the two MOSFETs 11 and 12. Since the MOSFETs are insulated gate devices they have a significant input capacitance and a near-infinite d.c. input resistance. Even for bipolar technologies such as TTL, for example, the input impedance becomes largely capacitative at high frequency. Since the input 15 is connected in the circuit of FIG. 1 to the output of the previous inverter 1-(k−1), the input voltage is $V_d(k-1)$, that is to say the output voltage of the inverter 1-(k−1).

The source-drain paths of the two MOSFETs 11 and 12 are represented by two current sources 110 and 120, respectively. Current source 110 supplies a current $I_n$ when the input voltage exceeds the threshold voltage $V_{tn}$ of the n-channel MOSFET 11 and current source 120 supplies a current $I_p$ when the input voltage is less than $V_{dd}$ minus the threshold voltage $V_{tp}$ of the p-channel MOSFET 12. The junction of the two current sources 110 and 120 forms the output 16 of the inverter 1-k, at a voltage $V_d(k)$. The output 16 is connected to the input 15' of the next inverter 1-(k+1) in the loop, and thus to the input capacitance C(k+1) of the inverter 1-(k+1), which thus forms an output capacitance of the inverter 1-k.

The inverter has an input voltage threshold $V_{thr}$ and assuming that the MOSFETs 11 and 12 are fully complementary, $V_{thr} = V_{dd}/2$. When a transition occurs, for example from a low input to a high input, the input capacitance C(k) is charged toward $V_{dd}$ until $V_{thr}$ is reached, whereupon current $I_n$ flows and discharges the output capacitance C(k+1) to make the output voltage $V_d(k)$ go low. On the transition from high to low input voltage, current $I_p$ charges the output capacitance until a high output voltage $V_d(k)$ is achieved.

The period 1/f of the oscillation will be proportional to the propagation delay through each inverter 1-k and to the number n of inverters. The propagation delay is in turn inversely proportional to the output currents $I_n$ and $I_p$ and proportional to the output capacitance C(k+1). The delay also depends on the threshold voltage $V_{thr}$, and so depends heavily on the supply voltage $V_{dd}$. Since the input capacitance of each inverter depends substantially on the structure and dimensions of the gates of the two MOSFETs 11 and 12 and all the inverters will normally be formed from nominally the same components, they will have substantially the same input capacitance C, assuming that they are all integrated on the same chip. C is typically less than one picofarad (1 pF).

The currents $I_n$ and and $I_p$ depend on the threshold voltages $V_{tn}$ and $V_{tp}$ of the MOSFETs 11 and 12 respectively, and on their gains $\beta_n$ and $\beta_p$ (beta$_n$ and beta$_p$). For simplicity, assume $V_{tn}=V_{tp}=V_t$ and $\beta_n=\beta_p=\beta$. As is well known, MOSFET threshold $V_t$ (not to be confused with the inverter threshold $V_{thr}$) can vary from 1 volt or less to more than 3 volts, depending on the process parameters, temperature and back-bias. The gain $\beta$ may, for example, be a few microamps per volt-squared ($\mu A V^{-2}$), according to well known MOSFET characteristic curves, but again is dependent on varying process and operating conditions.

FIG. 4 shows how the frequency f of oscillation (vertical axis) of the known CMOS ring oscillator depends on varying supply voltage $V_{dd}$ (horizontal axis). The frequency f (in kHz) has been divided in $\beta$ (in $\mu A V^{-2}$) and multiplied by C (in pF) to provide a normalized value, but it must be remembered that C and $\beta$ may be variable too. Frequency is plotted against $V_{dd}$ for three values of $V_1$: 1 V, 2 V and 3 V. The steep gradient and wide spacing of the curves shows that f varies greatly with many variables—some process-dependent, others dependent on operating conditions—and is thus hard to predict, especially if the supply voltage $V_{dd}$ may vary.

Another problem is that the inverters are working at close to their maximum frequency, which is also likely to be the maximum operating frequency of the circuitry which they are driving. It is not practicable to slow the oscillator down indefinitely merely by increasing the length of the loop (increasing n), because with more than about seven inverters higher modes of oscillation can occur, resulting from phase shifts of 3 times, 5 times or 7 times 180 degrees and so on.

A ring oscillator such as that of FIGS. 1 to 3 is described in copending UK patent application 8713385, which corresponds to U.S. application No. 203,407, filed June 6, 1988. The oscillator is used to drive a charge pump arrangement for biasing a power MOSFET in an integrated circuit for use in motor vehicles. In that application, the oscillator must drive large and relatively slow high-voltage MOSFETs, and so the high frequency is a problem. Another feature of the motor vehicle environment, and many others, is that the supply voltage $V_{dd}$ is very variable. Even if $V_{dd}$ is regulated so as to be not more than 12 V, it can easily fall to 5 V during operation of the starting motor, for example. Thus, the severe dependence of f on $V_{thr}LV_{dd}/2$ is a major problem in applications where a regulated supply is not available.

The problem of too high a frequency may be solvable by adding additional capacitance, for example, a few picofarads, at the input of each inverter. However, besides taking up a lot of semiconductor area, this does not solve the problem of dependence on process and operating variables, such as $\beta$, $V_t$, temperature and $V_{dd}$.

FIG. 5 is a block schematic diagram of an embodiment of a ring oscillator in accordance with the present invention. The oscillator comprises three inverting stages 301, 302 and 303. Stage 301 has an input 315, and an output 316 which is connected to an input 315' of stage 302, which in turn has an output 316' connected to an input 315'' of the third stage 303. The third stage has a further input 304, which forms a control input for the oscillator, and an output 316'' which is connected via feedback path 305 to the input 315 of the first stage 301. The third stage also has a logic output 306 which forms the output of the oscillator circuit. A reference circuit 307 is provided, which has a reference output 308 for supplying a signal REF to reference inputs 309, 309' and 309'' of the inverting stages 301, 302, and 303, respectively.

Figure 6:
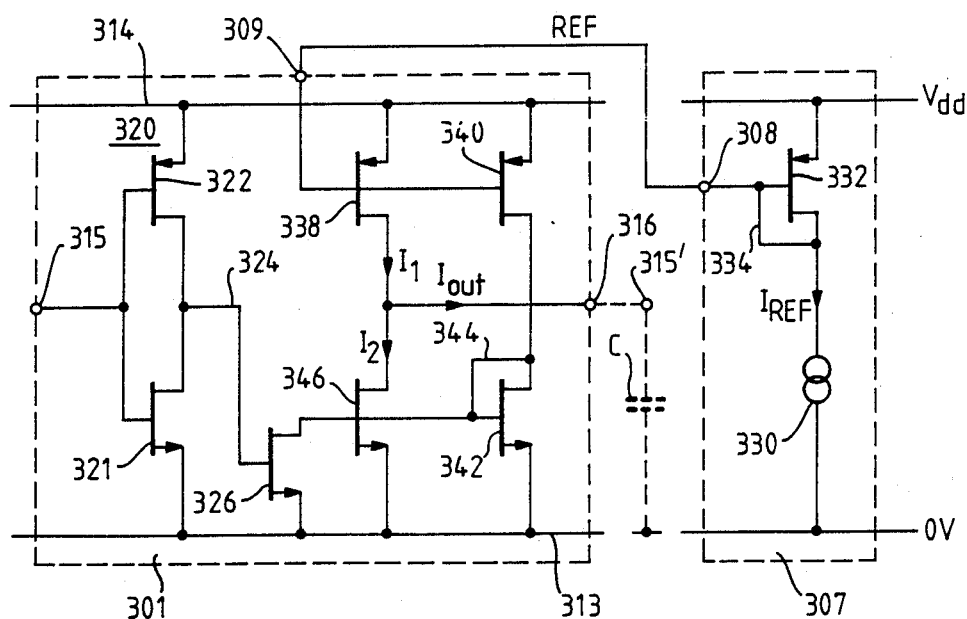
FIG. 6 shows in detail an embodiment of the first inverting stage of the oscillator of FIG. 5.

FIG. 6 shows in detail an embodiment of the first inverting stage 301 of the oscillator of FIG. 5. The circuit operates from two supply rails 313 (OV) and 314 ($V_{dd}$) which are not shown in FIG. 5. The input 315 of the circuit is formed in FIG. 6 by the input of a CMOS inverter 320 which comprises n- and p-channel MOSFETs 321 and 322, respectively. The output 324 of the inverter 320 drives the gate of an n-channel MOSFET 326 which has its source connected to supply rail 313 (OV).

The reference circuit 307 comprises a current source 330 which has an output connected at 334 to the gate and drain of a p-channel MOSFET 332, whose source is connected to supply rail 314 ($V_{dd}$). The gate-drain connection 334 of the MOSFET 332 forms the reference output 308 and is connected to the reference input 309 of the stage 301, which in turn is connected to the gate of a p-channel MOSFET 338, whose drain is connected to the output 316 of the inverting stage 301. The output 316 of the inverting stage 301 is connected to the input 315' of the next inverting stage 302, with its associated input capacitance C (shown dotted). The reference output 308 of the circuit 307 is also connected via input 309 to the gate of a further p-channel MOSFET 340, whose drain is connected at 344 to the drain and gate of an n-channel MOSFET 342. The gate-drain connection 344 of the MOSFET 342 is also connected to the gate of an n-channel MOSFET 346, whose drain is connected to the output 316 of the inverting stage 301. The sources of p-channel MOSFETs 338 and 340 are connected to supply rail 314 ($V_{dd}$) and the sources of n-channel MOSFETs 342 and 346 are connected to supply rail 313 (OV). The drain of n-channel MOSFET 326 is connected to the gates of n-channel MOSFETs 342 and 346.

The inverting stage 301 operates similarly to the equivalent circuit FIG. 3 of a conventional CMOS inverter, except that the output current is no longer simply the maximum output current the MOSFETs can supply at a given input voltage, but is regulated by means of the reference circuit 307. The MOSFET 332 passes a current $I_{REF}$ governed by the current source 330. The current $I_{REF}$ is mirrored in the drains of the p-channel MOSFETs 338 and 340. MOSFET 338 supplies a first scaled replica $I_1$ of $I_{REF}$ to the output 316, while MOSFET 340 supplies a second scaled replica of $I_{REF}$, which may be the same as or different from $I_1$, to the gate-drain connection 344 of the n-channel MOSFET 342.

Assuming first that the input 315 of the inverting stage 301 is held low (by the output of the stage 303, FIG. 5), then the output 324 of the inverter 320 is high and MOSFET 326 is turned 'on' (conducting). This turns off the n-channel MOSFETs 342 and 346 so that the output current $I_{OUT}$ is equal to $I_1$ and charge flows into the input capacitance C of the next stage 302 until the voltage at output 316 is high.

If, on the other hand, the input 315 is high, the inverter output 324 is low, and MOSFET 326 no longer turns off the MOSFETs 342 and 346. MOSFET 342 passes the second scaled replica of $I_{REF}$ and this is mirrored by MOSFET 346 to produce a third scaled replica $I_2$ of $I_{REF}$. $I_2$ is larger than $I_1$, by suitable scaling of the dimensions of transistors 338, 340, 342 and 346, and so when $I_2$ flows $I_{OUT} = -(I_2 - I_1)$ causing a net current flow into the output 316, which discharges the capacitance C until the output voltage is low. In the case where $I_2$ is twice $I_1$, then the charging and discharging currents are equal in magnitude. This gives a 1:1 mark-space ratio to the oscillator if the n- and p-channel devices are accurately complementary.

By a suitable choice of $I_{REF}$ and scaling of the dimensions of the transistors 332, 338, 340, 342 and 346, currents $I_1$ and $I_2 - I_1$ can be made much smaller than the output currents $I_n$, $I_p$ of the simple CMOS inverter (FIGS. 2 and 3), so that a low frequency of oscillation may be obtained without the need for a large input capacitance C. If $I_1$ and $I_2$ are very much smaller than $I_n$ and $I_p$, then the frequency f is substantially determined solely by the reference current $I_{REF}$, for a given $V_{dd}$. Of course, there will still be some component of the total delay which is governed by the process and operating variables, due to the inverter 320 and transistors 326 and 346, but if the time periods $CV_{thr}/I_1$ and $CV_{thr}/I_2$ are much longer than the small delay through the inverter, then those variations can be ignored.

In the embodiment of a complete oscillator shown in FIG. 5, the second and third inverting stages 302 and 303 are of the same general form as the stage 301 to allow optimum regulation of the frequency and mark-space ratio. In this embodiment, however, the third stage 303 also has additional features in the form of the gating input 304 ($\overline{ON}$) and the logic output 306.

The gating input 304 ($\overline{ON}$) can be provided by a simple modification of the circuit fo the first inverting stage 301 (FIG. 6) by which the input inverter 320 is replaced by a two-input logic gate, for example, a NOR gate. One input of the NOR gate forms the gating input 304, while the other input forms the input 315" of the stage 303. The oscillations can then be stopped and started by means of a logic signal $\overline{ON}$ applied to the input 304 ($\overline{ON}$=high for stopped and $\overline{ON}$=low for running).

The logic output 306 may be provided simply by a connection to the output of the NOR gate which forms the input stage of the inverting stage 303. Alternatively, the output 306 could have been taken from the output 324 of the inverter 320 in stage 301 or from the equivalent point in the second stage 302. The output thus provides a square wave output for the oscillator, the signals at terminals 316, 316' and 316" being trapezoidal or triangular waveforms.

Figure 7:
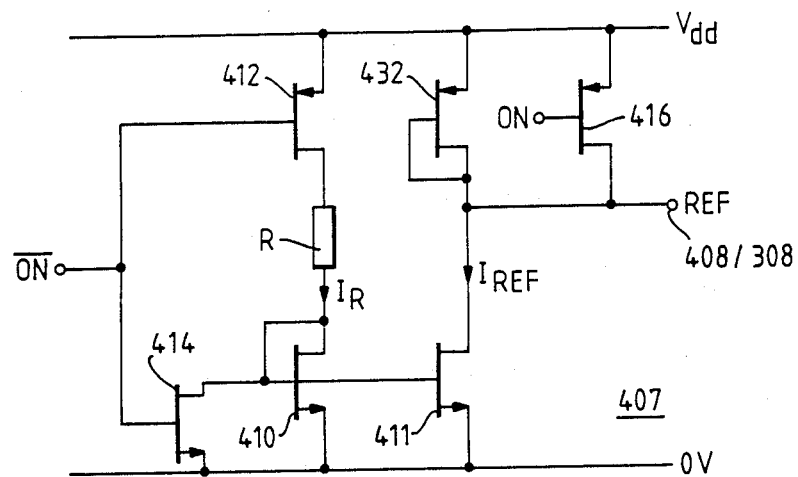
FIG. 7 shows a first embodiment of a reference circuit suitable for use in the circuit of FIGS. 5 and 6.

FIG. 7 shows a first embodiment 407 of the reference circuit 307 suitable for use in the circuit of FIGS. 5 and 6. The circuit has a reference output 408 (REF) which is equivalent to the terminal 308 of FIGS. 5 and 6. The circuit comprises a resistance R connected across the supply $V_{dd}$ in series with the input of an n-channel current mirror having an input transistor 410 and an output transistor 411. A p-channel MOSFET 412 and an n-channel MOSFET 414 are provided to disconnect R from $V_{dd}$ and to turn off the current mirror when the signal $\overline{ON}$ goes high, thus saving power when the oscillator is not running. The MOSFETs 412 and 414 need not be provided if power conservation is not necessary.

When the signal $\overline{ON}$ is low (oscillator running), a current $I_R$ flows into the n-channel current mirror and is scaled by a predetermined ratio to become the current $I_{REF}$. The current $I_{REF}$ flows through a p-channel MOSFET 432 which is equivalent to the MOSFET 332 of FIG. 6, and thus defines the reference voltage signal REF which is fed via terminal 408/308 to the inverting stages 301-303. The use of scaled dimensions in the transistors of the various current mirrors allows the reference currents and output currents to be chosen freely according to the characteristics of the components used. For example, this freedom allows the use of a resistance R which may readily be integrated with the other components in the circuit technology used, while allowing currents $I_1$ and $I_2$ to be regulated at low values. For example, with $V_{dd}=10$ V and R=50 kilohms, $I_R$ may be approximately 150 microamps, but with ratios $I_R:I_{REF}$ and $I_{REF}:I_1$ both equal to twelve, $I_1$ and $I_2$ will be of the order of one microamp only.

A p-channel MOSFET 416 is provided at the output 408 to turn off all the current sources in the oscillator circuit when the signal $\overline{ON}$ is low. MOSFET 416 need not be provided if power conservation is not necessary.

As $V_{dd}$ rises and falls, so the current $I_R$ and hence $I_{REF}$ rise and fall. Thus $I_1$ and $I_2$ (FIG. 6) vary approximately in proportion to $V_{dd}$ and the variation in the inverter input threshold $V_{thr}$ of each stage is compensated to some extent by a corresponding variation in the output current of the previous stage. Thus the time taken to charge each input capacitance C to the threshold $V_{thr}$ is less dependent on the value of $V_{thr}$ and the oscillator frequency f is consequently less sensitive to variations in $V_{dd}$.

Figure 8:
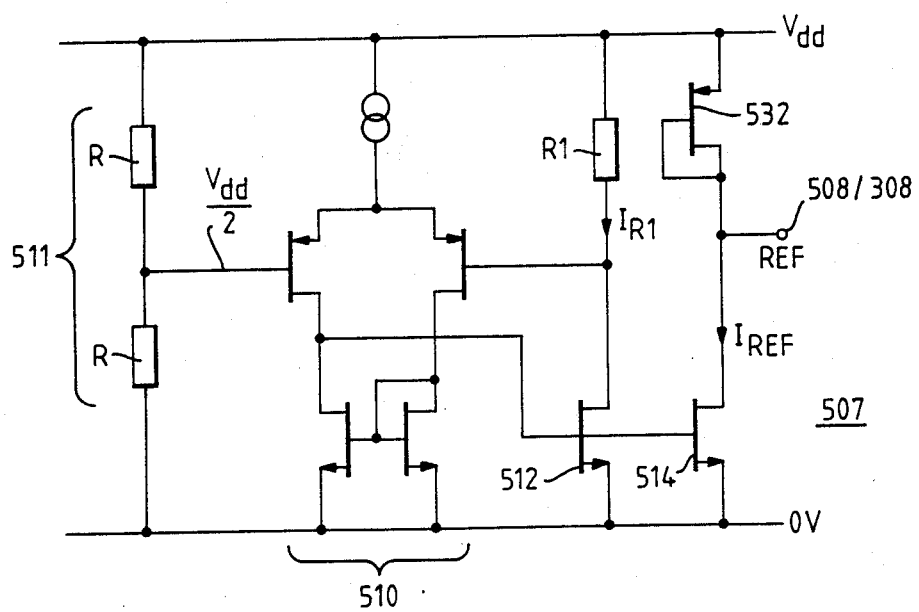
FIG. 8 shows a second embodiment of a reference circuit suitable for use in the circuit of FIGS. 5 and 6.

The compensation provided by the circuit of FIG. 7 is only approximate, chiefly because $I_R$ is not strictly proportional to $V_{dd}$ because of the voltage drops across the transistors 410 and 412. FIG. 8 shows a second embodiment 507 of the reference circuit 307 suitable for connection to the circuit of FIGS. 5 and 6. The reference output 308 is formed by a terminal 508 (REF). A potential divider 511 connected across the supply $V_{dd}$ comprises two equal resistances R and applies a voltage $V_{dd}/2$ to one input of a differential amplifier 510. Another resistance R1 is connected between $V_{dd}$ and the other input of the amplifier 510. The amplifier has a first n-channel output transistor 512 which controls the current through the resistance R1. This negative feedback arrangement forms a voltage follower so that the voltage across the resistance R1 is held equal to $V_{dd}/2$ and the current $I_{R1}$ is thus accurately proportional to $V_{dd}/2$. By choosing the value of R1, the absolute value of $I_{R1}$ can be defined. The amplifier 510 has a second n-channel output transistor 514 (N1) which generates a current $I_{REF}$ proportional to $I_{R1}$. The current $I_{REF}$ is used to generate the output reference signal REF by means of a p-channel transistor 532 which is equivalent to MOSFET 332 in FIG. 6. Again, scaling the dimensions of the various transistors allows a wide choice of values for R and $R_1$, while still providing very small regulated output currents $I_1$, $I_2$ for the inverting stages 301-303 (FIGS. 5 and 6). The currents $I_1$ and $I_2$ will be accurately proportional to $V_{dd}$, and so the circuit of FIG. 8 provides more accurate regulation of the frequency against drift of $V_{dd}$.

Even if operating conditions do not vary, or the dependence of f on operating variables is not important, the invention still provides a means of separating the functions of gain and delay into two separate parts of the inverting stage, providing the designer with freedom to design the oscillator desired, rather than that which the process dictates. Furthermore, the frequency of the oscillator can be controlled by a single circuit variable, for example, a voltage, a current or a resistance.

It should be appreciated that the utility of the invention extends beyond the provision of a constant frequency oscillator: measurement of operating conditions or of analog signal values is possible when the oscillator frequency is defined by a single but variable reference signal. For example, if the resistor R in FIG. 7 or resistor R1 in FIG. 8 were to be given a known temperature coefficient of resistance, the oscillator frequency f could provide a measure of temperature, since it is still stabilized against supply voltage variations.

It should further be appreciated that different embodiments of the inverter stage with regulated output currents may be suitable for use in a ring oscillator. For example, both currents $I_1$ and $I_2$ may be switchable, in anti-phase, to produce the required reversible output current. The currents $I_1$ and $I_2$ may be regulated independently of one another and by a suitable choice of the relative values of the currents $I_1$ and $I_2$ a desired mark-space ratio of the output signal may be selected, or by varying these currents a variable mark-space ratio may be achieved.

It is also possible of course to use more than three stages; five or seven, for example. However, since the invention provides inverting stages with long propagation delays which can be tailored to the application, there will not normally be a need to increase the number of stages above three merely to achieve a lower frequency.

From reading the present disclosure, other modifications will be apparent to persons skilled in the art. Such modifications may involve other features which are already known in the design and use of semiconductor circuits and component parts thereof and which may be used instead of or in addition to features already described herein. Although claims have been formulated to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

I claim:

1. A ring oscillator comprising, a plurality of cascaded inverting stages, each stage comprising an input circuit for detecting an output voltage of a preceding stage, characterized in that at least one inverting stage further comprises an output circuit having a current source that is controlled by said input circuit for supplying an output current to an input circuit of a succeeding stage.

2. A ring oscillator as claimed in claim 1, wherein all of the inverting stages in the ring oscillator are of the same form as the one inverting stage.

3. A ring oscillator as claimed in claim 1, wherein at least one input circuit comprises a logic circuit.

4. A ring oscillator as claimed in claim 3, wherein an input capacitance of the one inverting stage mainly comprises the inherent input capacitance of the logic circuit, the output current supplied to the succeeding stage being smaller in magnitude than an output current of said logic circuit.

5. A ring oscillator as claimed in claim 1, constructed in CMOS technology, wherein the output circuit is responsive to a supply voltage, which is also applied to an input circuit of the succeeding stage, in a manner so as to make the associated output current dependent on the supply voltage and thereby reduce the dependence of the frequency of oscillation on the supply voltage.

6. A ring oscillator as claimed in claim 1, comprising a reference circuit for determining a magnitude of the output current of at least one said output circuit.

7. A ring oscillator as claimed in claim 2 comprising a single reference circuit for determining the magnitudes of the output currents of the output circuits of all of the inverting stages.

8. A ring oscillator as claimed in claim 1, wherein the output circuit comprises a first current source for supplying a first current to an output of the one inverting stage at least when the voltage at the input circuit to the one inverting stage is in a first state, and a second current source for supplying a second current to the output, in the opposite direction to the first current, at least when the voltage at the input circuit to the one inverting stage is in a second state.

9. A ring oscillator as claimed in claim 8 wherein the first current source is enabled in either state of the voltage at the input circuit to the one inverting stage, the second current source being enabled only when the voltage at the input circuit to the one inverting stage is in said second state, the second current being greater in magnitude than the first current.

10. A ring oscillator as claimed in claim 9, wherein the magnitude of the second current is substantially twice that of the first current.

11. A ring oscillator as claimed in claim 9 wherein the output circuit comprises a first transistor connected between a first supply voltage terminal and the output of the one inverting stage, the first transistor forming the first current source and being connected to a reference input so as to determine the first current, the output circuit further comprising a second transistor also connected to the reference input and being connected to the first supply terminal and via a diode-connected third transistor to a second supply voltage terminal, the circuit further comprising a fourth transistor connected between the second supply terminal and the output of the one inverting stage, said fourth transistor comprising the second current source and being connected so as to mirror a current flowing in the third transistor, thereby defining the relative magnitudes of the first and second currents, a fifth transistor being connected between the second supply terminal and a control electrode of the fourth transistor so as to control conduction in the fourth transistor as a function of the state of the voltage at the input circuit.

12. A ring oscillator as claimed in claim 11 comprising a reference circuit which comprises a diode-connected sixth transistor connected between the second supply terminal and, via a resistance and a seventh transistor to the first supply terminal, the reference circuit further comprising an eighth transistor connected to the second supply terminal and via a diode-connected ninth transistor to the first supply terminal, and being connected to the sixth transistor so as to mirror a current flowing in said sixth transistor, a connection between the eighth and ninth transistors forming a reference output for connection to the reference input of the one inverting stage, the reference circuit further comprising a tenth transistor connected between a control electrode of the sixth transistor and the second supply terminal, and an eleventh transistor connected between the reference output and the first supply terminal, the seventh, tenth and eleventh transistors being connected so as to receive control signals for disabling the reference circuit.

13. A ring oscillator as claimed in claim 11 comprising a reference circuit which comprises: a long-tailed pair arrangement having its tail connected to the first supply terminal and having a current mirror active load circuit connected to the second supply terminal; a voltage divider connected between the supply terminals for biasing one transistor of the long-tailed pair; a series connection of a resistance connected to the first supply terminal and a sixth transistor connected to the second supply terminal and having a control electrode connected to an output of the current mirror active load circuit, a junction of the resistance and the sixth transistor being connected to a control electrode of the other transistor in the long-tailed pair, a seventh transistor having a control electrode connected to said current mirror output, said seventh transistor being connected to the second supply terminal and via a diode-connected eighth transistor to the first supply terminal, a connection between the seventh and eighth transistors forming a reference output for connection to the reference input of the one inverting stage.

14. A ring oscillator comprising: an odd number plurality of inverting stages connected in cascade in a loop circuit, each stage comprising an input circuit and an output circuit with the input circuit coupled to the output circuit of a preceding inverting stage of the loop circuit and responsive to an output voltage at an output terminal of the output circuit, and a reference circuit coupled to the output circuit of at least one inverting stage, said reference circuit including a controlled transistor current source coupled to the input circuit of said one inverting stage and responsive to a voltage developed in said input circuit in a manner so as to control the output circuit to supply a controlled output current to the input circuit of a succeeding inverter stage of the loop circuit thereby to regulate the oscillation frequency of said ring oscillator.

15. A ring oscillator as claimed in claim 14 wherein the input circuit and the output circuit of said one inverting stage and said reference circuit are coupled to a source of DC supply voltage, said reference circuit and said output circuit being responsive to variations in amplitude of said DC supply voltage in a manner so as to make the output current of said one inverting stage dependent on the amplitude of the DC supply voltage such that the oscillation frequency is relatively independent of the DC supply voltage.

16. A ring oscillator as claimed in claim 14 wherein at least one other inverting stage of the ring oscillator is of the same form as said one inverting stage, and wherein said reference circuit is coupled to said one other inverting stage so that the output circuit thereof supplies a controlled output current to the input circuit of its succeeding inverting stage of the loop circuit, the single reference circuit thereby determining output current amplitudes of the output circuits of said one inverting stage and said at least one other inverting stage.

17. A ring oscillator as claimed in claim 14 wherein said output circuit of the one inverting stage comprises first and second current sources for supplying to said output terminal first and second opposed currents as a function of a voltage developed in the input circuit of said one inverting stage.

18. A ring oscillator as claimed in claim 17 wherein said first current source supplies a first current to said output terminal independent of the voltage in said input circuit and said second current source supplies a second current to said output terminal that is determined substantially by the amplitude of said input circuit voltage.

* * * * *